United States Patent [19]
Nakajima et al.

[11] Patent Number: 5,204,276
[45] Date of Patent: Apr. 20, 1993

[54] METHOD OF MANUFACTURING SEMICONDUCTOR DEVICE

[75] Inventors: Hiroomi Nakajima, Yokohama; Nobuyuki Itoh, Tokyo; Hiroyuki Nihira, Ayase; Eiryo Tsukioka, Tokorozawa; Kenji Hirakawa, Yokohama; Shin-ichi Taka, Yokosuka; Hideki Takada, Yokohama; Yasuhiro Katsumata, Chigasaki; Toshio Yamaguchi, Tokyo, all of Japan

[73] Assignee: Kabushiki Kaisha Toshiba, Kawasaki, Japan

[21] Appl. No.: 645,313

[22] Filed: Jan. 24, 1991

Related U.S. Application Data

[63] Continuation of Ser. No. 445,741, Dec. 4, 1989, abandoned.

[30] Foreign Application Priority Data

Dec. 6, 1988 [JP] Japan ................. 63-306900

[51] Int. Cl.⁵ ......................................... H01L 21/265
[52] U.S. Cl. ........................................ 437/31; 437/33; 437/203; 437/162; 437/909; 148/DIG. 9; 148/DIG. 124
[58] Field of Search .................. 437/31, 33, 203, 193, 437/194, 195, 162, 909, 190; 148/DIG. 9, DIG. 124

[56] References Cited

U.S. PATENT DOCUMENTS

| | | | |
|---|---|---|---|
| 4,125,426 | 11/1978 | Inayoshi et al. | 437/162 |
| 4,375,999 | 3/1983 | Nawata et al. | 437/162 |
| 4,483,726 | 11/1984 | Isaac et al. | 437/31 |
| 4,531,282 | 7/1985 | Sakai et al. | 437/193 |
| 4,581,319 | 4/1986 | Wieder et al. | 430/314 |
| 4,700,458 | 10/1987 | Suzuki et al. | 437/84 |
| 4,800,176 | 1/1989 | Kakumu et al. | 437/193 |
| 4,855,248 | 8/1989 | Ariizumi et al. | 437/43 |
| 4,892,837 | 1/1990 | Kudo | 437/33 |

FOREIGN PATENT DOCUMENTS 0042380 12/1981 European Pat. Off.
0081862 10/1985 Japan.
0188370 2/1988 Japan.

OTHER PUBLICATIONS

Tauber et al., Silicon Processing for the VLSI Era, vol. 1, pp. 335, 367, 1986.
Ting, "Tin Formed by Evaporation as a Diffusion Barrier Between Al and Si", J. Vac. Sci. Technol. 21(1) May/Jun. 1982 pp. 14–18.
Degen Kolb, "Aluminum Sputter Etching Using $SiCl_4$", pp. 1150–1151, GTE Laboratories.
Chang, "Effects of Differential Etching and Masking Resist Preparation of the Quality of the Reactive-ion-etched Aluminum and Aluminum Alloys", Journal of Electronic Materials, vol. 13, No. 6, pp. 955–967, 1984.

*Primary Examiner*—Brian E. Hearn
*Assistant Examiner*—Tuan Nguyen
*Attorney, Agent or Firm*—Oblon, Spivak, McClelland Maier & Neustadt

[57] ABSTRACT

In the method of manufacturing a semiconductor device, a buffer oxide film, an oxidation-resistant film and a first poly-Si film containing a p-type impurity are successively formed to form a laminate structure on the n-type collector region, followed by forming a protective oxide film by CVD. Then, an opening portion reaching the oxidation-resistant film is formed, followed by forming a second protective insulation film to cover the surface of the first poly-Si film exposed at the side wall of the opening portion. The oxidation-resistant film is excessively etched using the protective insulation films as an etching mask so as to expose the buffer oxide film and to form a bore below the first poly-Si film. The exposed buffer oxide film is removed, followed by filling the bore with a second poly-Si film. Then, a heat treatment is performed under an oxidative atmosphere to form a thermal oxide film covering the surface of the second poly-Si film. At the same time, the p-type impurity contained in the first poly-Si film is diffused through the second poly-Si film into the collector region to form a p-type outer base region. Further, a p-type inner base region, n-type emitter region and an emitter electrode are formed.

8 Claims, 12 Drawing Sheets

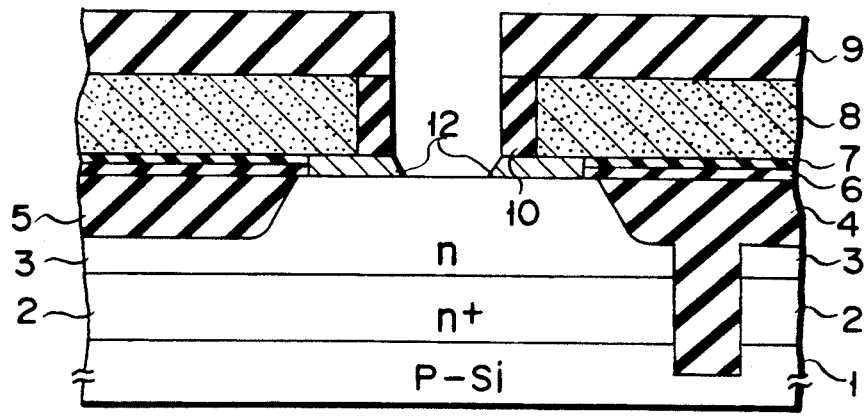
F I G. 2D
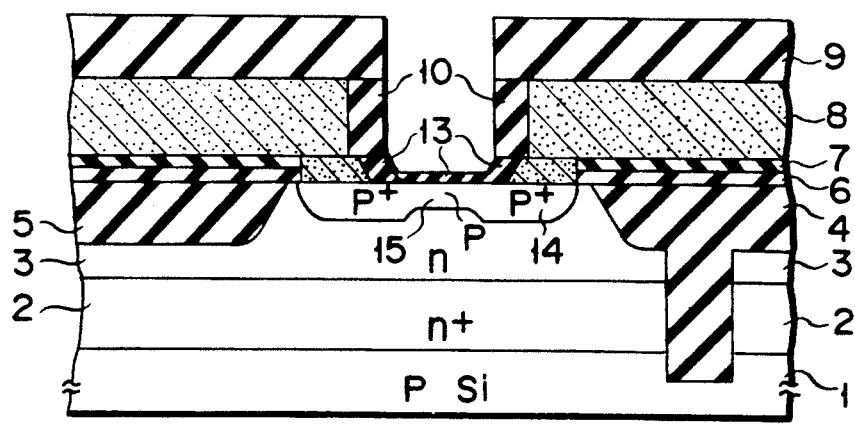
F I G. 2E

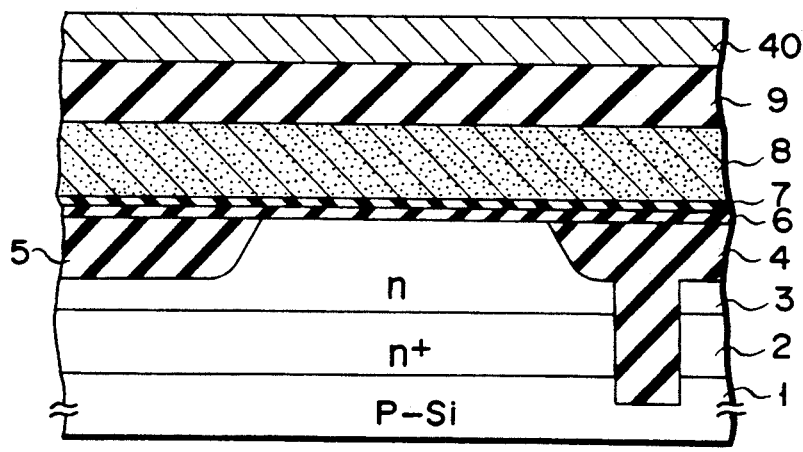
F I G. 6A
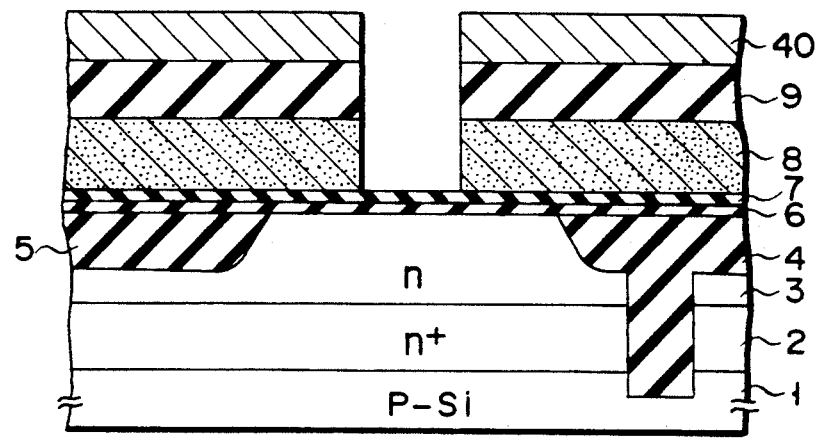
F I G. 6B
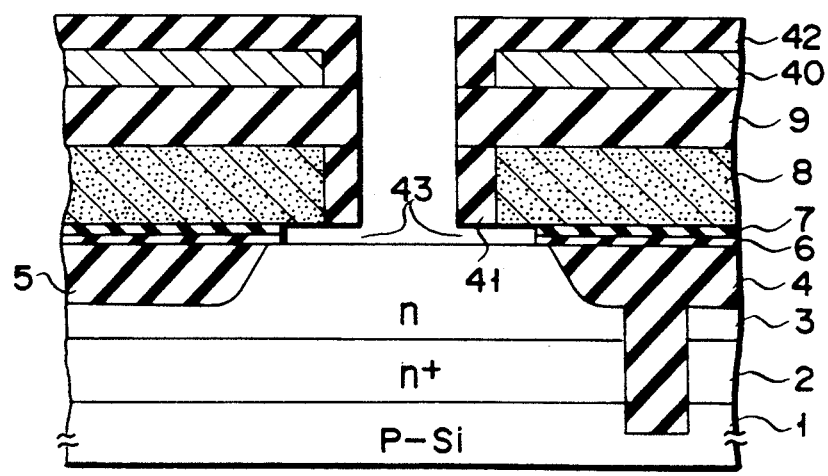
F I G. 6C

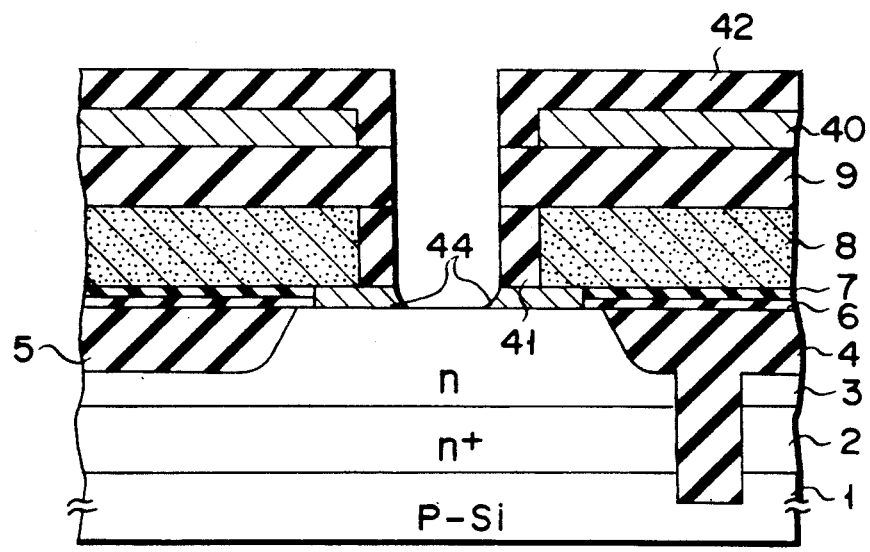
F I G. 6D
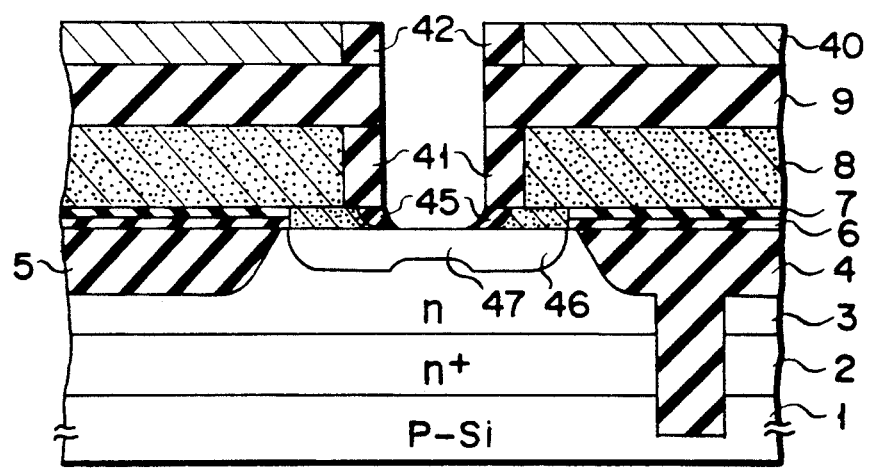
F I G. 6E

METHOD OF MANUFACTURING SEMICONDUCTOR DEVICE

This application is a continuation of application Ser. No. 07/445,741, filed on Dec. 4, 1989, now abandoned.

BACKGROUND OF THE INVENTION

1. Field of the Invention

The present invention relates to a method of manufacturing a semiconductor device, particularly, a method of manufacturing a bipolar transistor which permits accurately forming a base region and an emitter region by self-alignment.

2. Description of the Related Art

High performance bipolar transistors having a high cut-off frequency, which can be integrated in an LSI, are required in various fields such as electronic computers, optical communication and various analog circuits. To achieve such a high performance, it is important to form the base and emitter regions by self-alignment. Several techniques for the self-alignment have already been proposed in, for example, the publications listed below:

(1) Japanese Patent Disclosure 54-155778
(2) IEEE Trans. on Electron Device, Vol. ED-33, April 1986, p. 525
(3) Japanese Patent Disclosure 58-7862
(4) IEDM' 86, 1986, p. 420
(5) Japanese Patent Disclosure 60-81862

These techniques have already enabled the bipolar transistor to have a cut-off frequency of about 30 GHz.

For example, FIGS. 1A to 1E collectively show the prior art described in Japanese Patent Disclosure 60-81862 noted above. Used in this prior art is a wafer prepared by forming an $n^+$ type buried region 102 and a P-type channel stopper region 104 in a P-type silicon substrate 101, followed by forming an N-type epitaxial layer 103 on the entire surface. As shown in FIG. 1A, the wafer surface is selectively oxidized so as to form a thick field oxide film 105 surrounding the element region. Then, a thin thermal oxide film 106 is formed on the surface of the element region, followed by successively depositing a silicon nitride film 107 and a first poly-Si film 108. The undesired portion of the first poly-Si film, which is positioned above the field oxide film 105, is selectively oxidized to form an oxide film 109. Then, the remaining poly-Si film 108 is doped with boron by means of ion implantation, followed by applying a selective etching to the poly-Si film 108 to form an opening.

After the selective etching, a heat treatment is applied under an oxidative atmosphere to form a thermal oxide film 110 on the surface of the poly-Si film 108, as shown in FIG. 1B. Using the thermal oxide film 110 thus formed as an etching mask, the silicon nitride film 107 is selectively etched with a hot aqueous solution of phosphoric acid so as to expose the thermal oxide film 106. Then, the exposed thermal oxide film 106 is etched with an aqueous solution of NH$_4$F so as to expose the wafer surface in the element region. Incidentally, the silicon nitride film 107 is intentionally over-etched to form an overhanging portion 111, with the result that the wafer surface below the poly-Si film 108 is partly exposed.

In the next step, the free space in the overhanging portion is filled with a second poly-Si film 112, as shown in FIG. 1C. To form the second poly-Si film 112, a second poly-Si film is deposited by CVD on the entire surface under the conditions which permit the deposited poly-Si to fill the overhanging portion, followed by etching back the deposited poly-Si until the oxide film 109 and the wafer surface within the opening are exposed.

After formation of the second poly-Si film 112, the exposed surfaces of the element region and the second poly-Si film 112 are thermally oxidized to form an oxide film 113, as shown in FIG. 1D. During the heat treatment, the borons doped in advance in the first poly-Si film 108 are diffused into the second poly-Si film 112 and, then, into the epitaxial layer 103, with the result that a P-type outer base region 114 is formed within the element region. Subsequently, P-type inner base region 115 is formed by ion implantation of boron through the emitter opening.

Then, a CVD insulation film 116 and a third poly-Si film 117 are successively deposited, followed by etching back these films by reactive ion etching so as to leave laminated films 116 and 117 only on the side wall of the opening. Further, the thermal oxide film 113 within the opening portion is etched, with the third poly-Si film 117 used as a mask, so as to expose the wafer surface. After the exposure, a fourth poly-Si film 118 doped with a high concentration of arsenic is deposited, followed by heat treatment for diffusing the arsenic so as to form an N-type emitter region 119.

The fourth poly-Si film 118 is patterned in the shape of an electrode, as shown in FIG. 1D, followed by depositing an aluminum film 120 on the entire surface. Finally, the aluminum film 120 is patterned in the shape of an electrode, as shown in FIG. 1E, so as to manufacture a desired bipolar transistor. It should be noted that the first and second poly-Si films 108 and 112 are used as a part of the base electrode. Also, the fourth poly-Si film 118 is used as a part of the emitter electrode.

The prior art described above permits forming the base regions 114, 115 and the emitter region 119 by self-alignment. It is also possible to achieve a fine structure in which the emitter width can be diminished to as small as 0.35 μm. However, serious problems remain unsolved in this prior art.

First of all, it is impossible to secure a sufficient thickness of the thermal oxide film 110. It should be noted that the oxide film 110 is used as an etching stopper in the step of etching the thermal oxide film 113 for forming the electrode wiring as well as in the steps of patterning the poly-Si film 118 and the aluminum film 120. What should also be noted is that the thickness of the thermal oxide film 110 is considerably reduced in the preceding etching steps, with the result that, in the step of forming the electrode wiring, the oxide film 110 does not have a thickness large enough to perform the function of an etching stopper. It follows that the thermal oxide film 110 tends to be removed in the etching step for forming the electrode wiring. In this case, the poly-Si film 108 positioned below the oxide film 110 is etched, leading to breakage of the base electrode.

Suppose the thermal oxide film 110 is formed thick in the step shown in FIG. 1B in an attempt to prevent the base electrode breakage. In this case, the thickness of the first poly-Si film 108 acting as the base electrode is reduced, leading to an increased base resistance. In order to increase the thickness of the thermal oxide film 110 while keeping the base resistance low, it is necessary to form the first poly-Si film 108 sufficiently thick in the step shown in FIG. 1A. If the first poly-Si film 108 is thickened, however, a long time is required for the uniform boron doping by ion implantation. It is very difficult to perform an ion implantation for such a long time by the ion implantation apparatus variable nowadays. It should also be noted that out-diffusion of boron from the first poly-Si film 108 is brought about by the heat treatment for forming the thermal oxide film 110. The reduction in the boron concentration in the first poly-Si film 108 thus caused leads to a further increase in the base resistance.

Another difficulty inherent in the prior art is that the thickness of the insulation film interposed between the poly-Si films 117, 118 forming the emitter electrode and the poly-Si film 108 forming the base electrode is reduced in the etching steps noted previously. As a result, current leakage and reduction in the withstand voltage tend to take place between the emitter and base regions. Particularly, stress is concentrated on the thermal oxide film positioned at the corner portions of the poly-Si films 108 and 112 forming the base electrode. Naturally, the etching rate in the corner portion of the thermal oxide film is higher than in the other portion. It follows that short-circuiting between the emitter and base regions tends to take place in the corner portion.

An additional difficulty to be noted is that the aluminum wiring 120 shown in FIG. 1E is formed after the step of patterning the fourth poly-Si film 118 acting as the emitter electrode. In other words, the aluminum film is formed on the underlying layer having sharp steps. It follows that the aluminum wiring 120 is likely to be broken easily.

SUMMARY OF THE INVENTION

An object of the present invention is to provide a method of manufacturing a semiconductor device, which permits overcoming the above-noted defects inherent in the prior art. In the present invention, the first poly-Si film 108 is covered with an oxide film thick enough to sufficiently perform the function of an etching stopper even in the etching step for forming an electrode wiring. At the same time, the first poly-Si film 108 has a resistance low enough to act as the base electrode.

Another object is to provide a method which permits preventing short-circuiting or current leakage between the emitter and base electrodes and also permits preventing the withstand voltage from being lowered.

Still another object is to provide a method which permits preventing the aluminum wiring 12 from being broken.

According to the present invention, there is provided a method of manufacturing a semiconductor device, comprising:

the step of successively laminating a buffer insulation film, an oxidation-resistant insulation film and a first conductor film containing an impurity of a second conductivity type on a semiconductor layer having a collector region of a first conductivity type;

the step of forming a first protective insulation film by a deposition method on the first conductor film;

the step of forming an opening portion exposing the oxidation-resistant insulation film by selectively etching the protective insulation film and the first conductor film, an emitter diffusion region being formed later below said opening portion;

the step of forming a second protective insulation film to cover the surface of the first conductor film exposed at the side wall of the opening portion;

the step of etching the oxidation-resistant insulation film exposed at the bottom of the opening portion using the first and second protective insulation films as an etching mask so as to expose the buffer insulation film, a predetermined size of a bore being formed by the side etching below the conductor film;

the step of etching the exposed buffer insulation film to expos the surface of the collector region of the semiconductor layer;

the step of burying in the bore a second conductor film capable of an insulation film formation by the surface oxidation and also capable of an impurity diffusion;

the step of applying a heat treatment under an oxidative atmosphere to form a thermal oxide film covering the exposed surface of the collector region and the surface of the second conductor film buried in the bore and to diffuse the impurity of the second conductivity type contained in the first conductor film into the collector region through the second conductor film so as to form an outer base region of the second conductivity type;

the step of doping the collector region with an impurity of the second conductivity type through the opening portion so as to form an inner base region of the second conductivity type; and the step of doping the inner base region with an impurity of the first conductivity type so as to form an emitter region of the first conductivity type and to form an emitter electrode which is in ohmic contact with the emitter region.

The first conductor film is used as a part of the base electrode in the present invention, too. It should be noted that the first protective insulation film for protecting the first conductor film is formed in the present invention by a deposition method, not by the thermal oxidation of the first conductor film. Thus, it is possible to form the first protective insulation film sufficiently thick regardless of the thickness of the first conductor film. It follows that, even if the thickness is somewhat reduced in the subsequent etching step, the first protective insulation film retains a sufficient thickness, with the result that it is possible to prevent the breakage of the first conductor film as well as the short-circuiting and reduction in the withstand voltage between the emitter and base regions.

It should also be noted that, since a deposition method is employed for forming the first protective insulation film, the thickness of the first conductor film is not reduced, making it possible to avoid the problem of the prior art, i.e., the problem of an increased base resistance.

BRIEF DESCRIPTION OF THE DRAWINGS

FIGS. 2A, 2B, 2C, 2D, 2E and 2F are cross sectional views collectively showing a method according to a first embodiment of the present invention for manufacturing a semiconductor device;

FIGS. 6A, 6B, 6C, 6D, 6E and 6F are cross sectional views collectively showing a method according to a fifth embodiment of the present invention for manufacturing a semiconductor device;

BRIEF DESCRIPTION OF THE PREFERRED EMBODIMENT

Figure 2A:
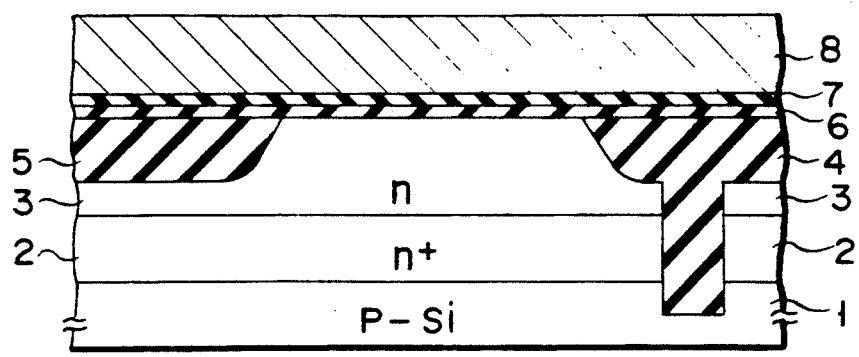

A first embodiment of the present invention is shown in FIGS. 2A to 2F, which are directed to the manufacture of a bipolar transistor. In the first step, an n+-type buried region 2 is formed in a p-type silicon substrate 1, followed by forming an n-type epitaxial layer 3 of a relatively low impurity concentration (about $1 \times 10^{16} cm^{-2}$) by a gaseous phase epitaxial growth method, as shown in FIG. 2A. Then, a field oxide film 4 for the element separation and a field oxide film 5 for separating the emitter region from the collector contact portion are formed by a trench technique and a selective oxidation technique. The n-type epitaxial layer 3, which is connected to a collector contact region (not shown) via the n+-type buried region 2, functions as a collector region. After formation of the field oxide films, the wafer surface is thermally oxidized to form a thermal oxide film 6 about 500 Å thick followed by depositing a silicon nitride film 7 about 1000 Å thick by CVD (chemical vapor deposition). Further, a first poly-Si film 8 about 4000 Å thick is deposited on the entire surface of the wafer by CVD.

Figure 2B:
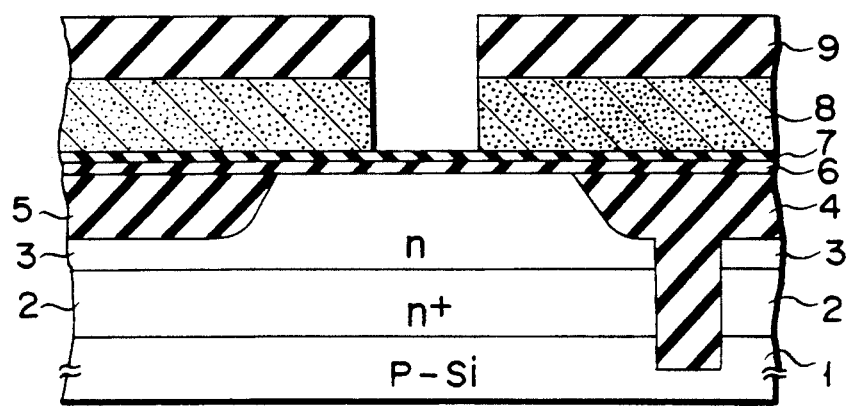

In the next step, boron ions are implanted into the first poly-Si film 8 at a dose of $1 \times 10^{16} cm^{-2}$ under an accelerating energy of 50 KeV, as seen from FIG. 2B. The ion implantation method may be replaced by a method in which a boron-containing gas is introduced in the step of CVD for forming the first poly-Si film 8 to enable the deposited poly-Si film 8 to be doped with boron. However, the ion implantation method is desirable in terms of the control of the impurity concentration.

After the ion implantation, a silicon oxide film 9 about 3000 Å thick is deposited on the entire surface of the wafer by CVD. The CVD oxide film 9 is formed in place of the thermal oxide film 110 formed in the conventional method in the step of FIG. 1B. The restrictions as in the conventional thermal oxide film 110 need not be considered in forming the oxide film 9 which is formed by CVD. To be more specific, it is possible to form the oxide film 9 sufficiently thick in view of only the function of the oxide film 9. It should also be noted that the CVD oxide film 9 can be formed at such a low temperature as about 600° C., in contrast to about 900° to 1000° C. of the oxidizing temperature for forming the thermal oxide film 110 by the conventional method. Since the oxide film 9 is formed at a relatively low temperature, it is possible to suppress the out-diffusion of boron doped in the first film 8 into the oxide film 9. This is effective for maintaining the low resistance of the poly-Si film 8. After formation of the CVD oxide film 9, PEP (photo-engraving process) is applied to the laminate structure consisting of the CVD oxide film 9 and the poly-Si film 8 so as to form an opening portion at a position corresponding to an emitter diffusion region. As seen from FIG. 2B, the silicon nitride film 7 is exposed at the bottom of the opening portion.

Figure 1A:
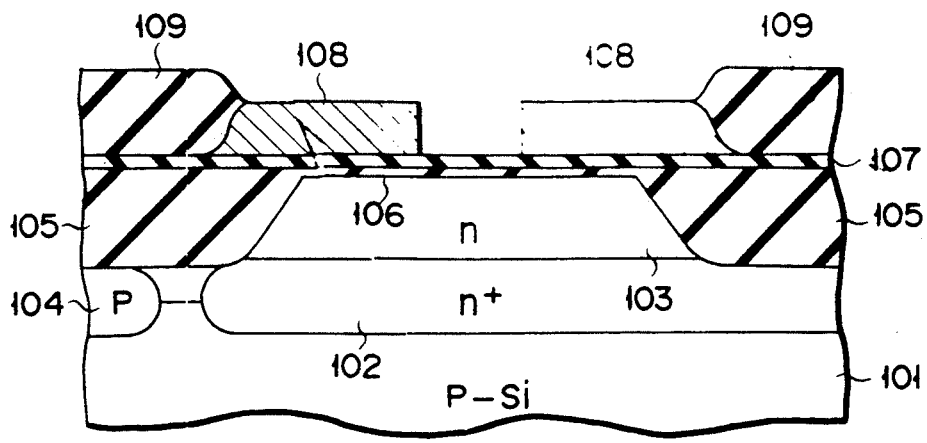
FIGS. 1A, 1B, 1C, 1D and 1E are cross sectional views collectively showing a conventional method of manufacturing a semiconductor device.
Figure 1B:
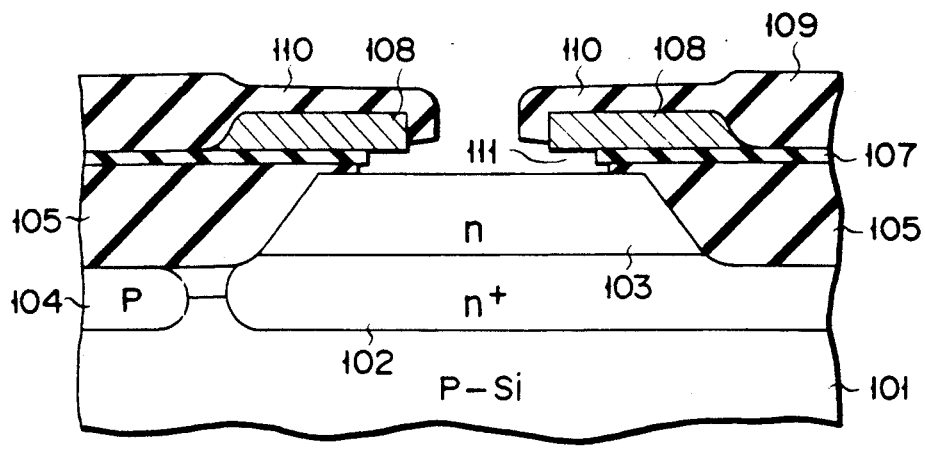
Figure 1C:
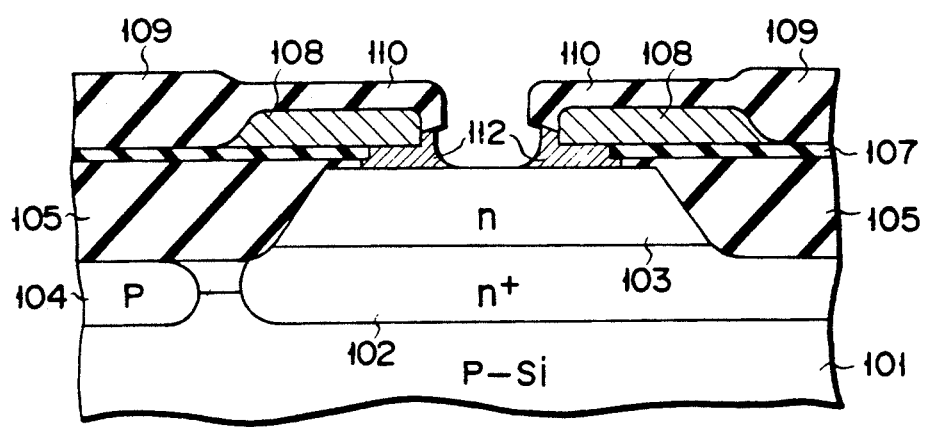
Figure 1D:
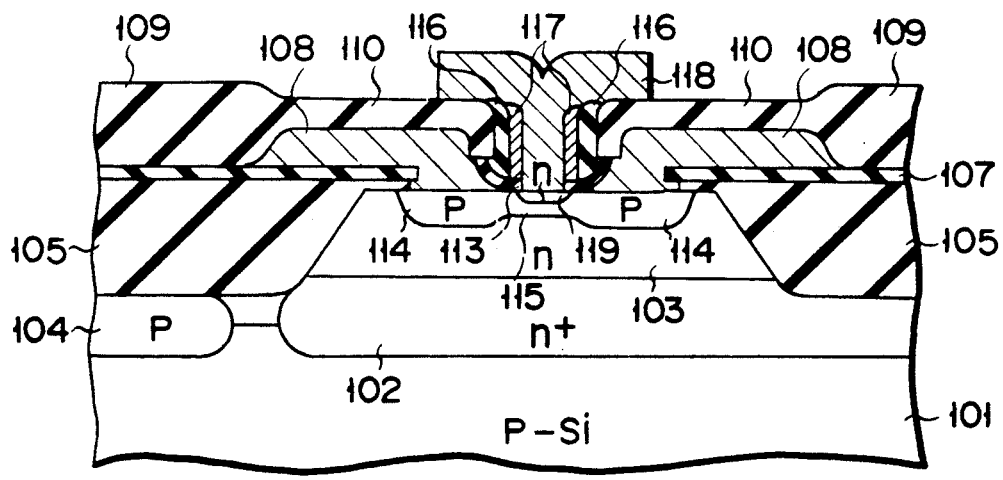
Figure 1E:
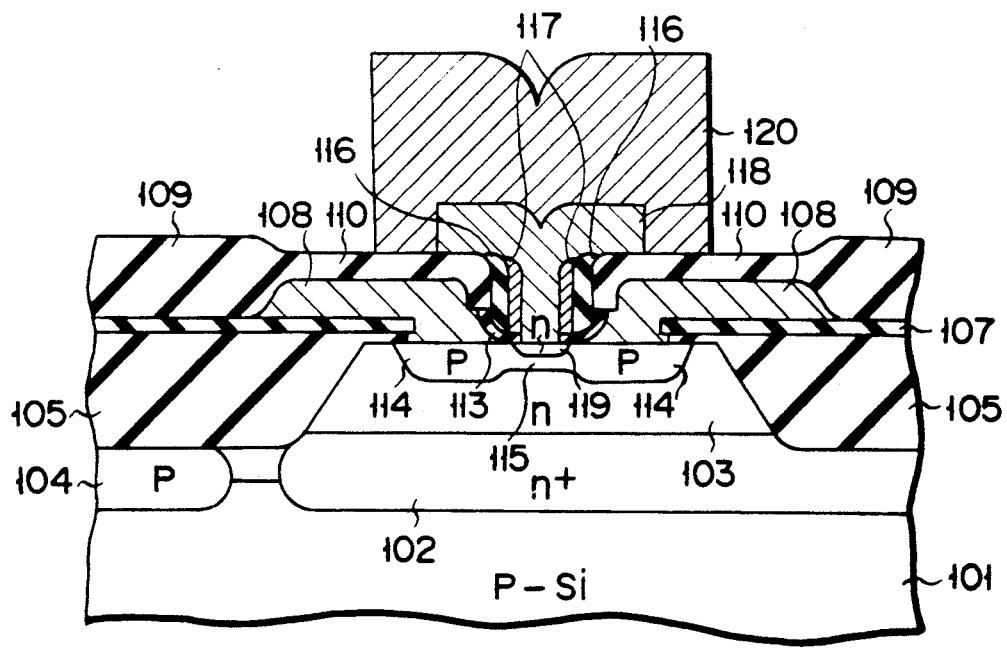
Figure 2C:
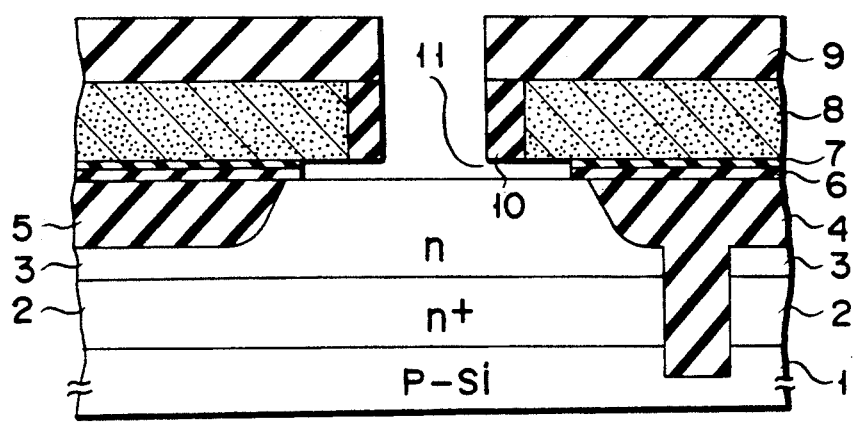

Under the state shown in FIG. 2B, a wet oxidation is performed at 950° C. so as to form a thermal oxide film 10 about 1500 Å thick to cover the side wall of the first poly-Si film 8, as shown in FIG. 2C. The temperature in this thermal oxidation step is substantially equal to the temperature employed in the conventional method for forming the thermal oxide film 110 (FIG. 1B). However, since the time for the thermal oxidation step of this embodiment is markedly short, it is possible to prominently suppress the out-diffusion of boron from the first poly-Si film, compared with the conventional method shown in FIG. 1. In other words, the method of the present invention is effective for maintaining the low resistance of the first poly-Si film 8.

In the next step, the silicon nitride film 7 within the opening portion is removed by etching with a hot phosphoric acid, with the thermal oxide film 10 and the CVD oxide film 9 used as an etching mask. In this step, the etching is continued even after the thermal oxide film 6 below the silicon nitride film 6 has been exposed so as to achieve about 3000 Å of side etching of the silicon nitride film 7. As a result, a bore 11 is formed right under the poly-Si film 8. Then, the exposed thermal oxide film 6 is etched with, for example, a NH$_4$F solution so as to expose the surface of the n-type epitaxial layer 3, as shown FIG. 2C.

The bore 11 shown in FIG. 2C is filled with a second poly-Si film 12, as shown in FIG. 2D. To be more specific, the second poly-Si film is deposited first by CVD on the entire surface under the conditions which permit filling the bore 11 with the poly-Si. Then, the deposited poly-Si film is etched back by reactive plasma etching until the CVD oxide film 9 and the wafer surface within the opening portion are exposed so as to form the second poly-Si film 12 as shown in FIG. 2D. The reactive plasma etching referred above is an isotropic chemical etching using a mixed gas of CF$_4$ and O$_2$ as an etchant.

After formation of the second poly-Si film 12, a heat treatment is performed under an oxidative atmosphere so as to form a thermal oxide film 13 about 700 Å thick in a manner to cover the exposed surface of the epitaxial layer 3 and the side wall of the second poly-Si film 12, as shown in FIG. 2E. During the heat treatment, the boron doped in advance in the first poly-Si film 8 is diffused into the second poly-Si film 12 and into the epitaxial layer 3 to form a p+-type outer base region 14. Then, boron ions are implanted under an accelerating energy of 20 KeV and at a dose of $2 \times 10^{13} cm^{-2}$ through the opening portion to form a p-type inner base region 15 within the epitaxial layer 3.

Then, a reactive sputter etching is selectively applied to the oxide film 13 at the bottom portion of opening portion so as to remove the oxide film 13. As a result, the epitaxial layer 3 is exposed and an emitter diffusion window is formed. The reactive sputter etching noted above is an anisotropic etching by RIE using a mixed gas of CHF$_3$ and O$_2$ as an etchant.

Figure 2F:
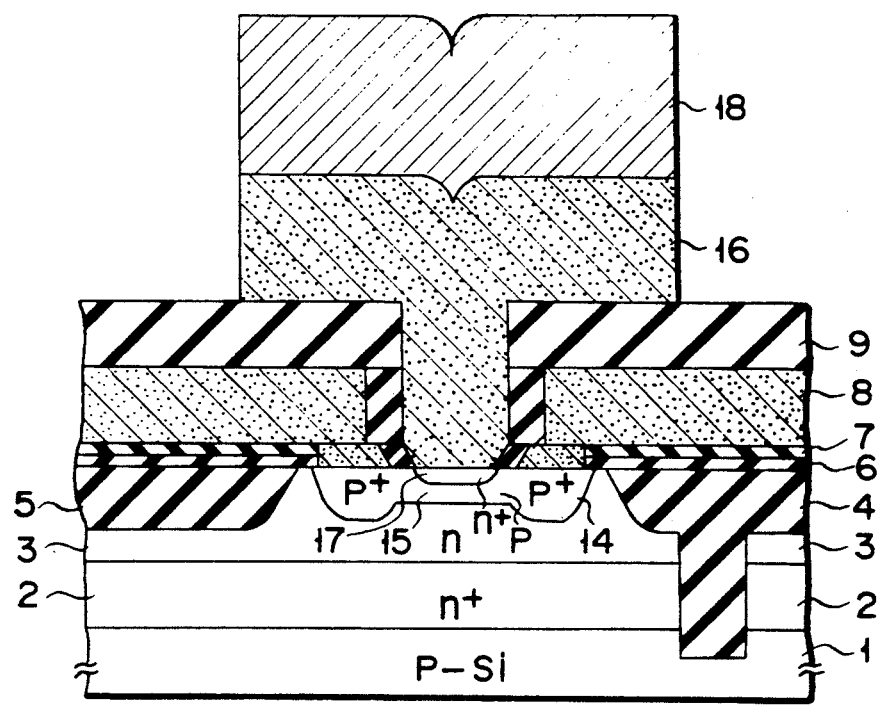

In the next step, a third poly-Si film 16 about 2000 Å thick is deposited by CVD on the entire surface, followed by implanting arsenic ions into the poly-Si film 16 under an accelerating energy of 50 KeV and at a dose of $1 \times 10^{16} cm^{-2}$. Then, a heat treatment is applied to permit the arsenic within the poly-Si film 16 to be diffused into the inner base region 15 so as to form an n+-type emitter region 17, as shown in FIG. 2F. At the same time, the outer base region 14 and the inner base region 15 are turned into the final diffusion layers. After the heat treatment, a base contact reaching the first poly-Si film 8 is formed by PEP, followed by forming an aluminum film 18 on the entire surface by vacuum evaporation.

Finally, the aluminum film 18 and the third poly-Si film 16 are patterned together by PEP to form the required electrodes and wirings, thereby producing a desired bipolar transistor. In this PEP step, the CVD oxide film 9 is used as an etching stopper. As described previously, the CVD oxide film 9 has a thickness large enough to perform the function of the etching stopper. Naturally, the second poly-Si film 8 used as the base electrode is sufficiently protected from the etching by the CVD oxide film 9. It follows that the base electrode is prevented from being broken. It is also possible to prevent the short-circuiting between the emitter and base regions.

In the embodiment shown in FIGS. 2A to 2F, the CVD oxide film 9 is as thick as 3000 to 5000 Å, making it possible to prevent the short-circuiting between the third poly-Si film 16 and the first poly-Si film 8 and between the third poly-Si film 16 and the second poly-Si film 12. Also, it is possible to ensure a sufficient final thickness of the first poly-Si film 8 and to suppress the diffusion of the boron doped in the first poly-Si film 8 into the oxide films 9 and 10, leading to a low base resistance. Incidentally, the base resistance can be lowered to 200 Ω/ the embodiment of FIG. 2 in contrast to 1 kΩ/ in the prior art shown in FIG. 1. What should also be noted is that the third poly-Si film 16 and the aluminum film 18 are patterned together in the embodiment shown in FIG. 2; whereas these films are separately patterned in the prior art. Since PEP is performed only once in the present invention for patterning these films, the reduction in the thickness of the silicon oxide film 9 used as an etching stopper is suppressed, with the result that the short-circuiting or reduction in the withstand voltage is effectively prevented between the emitter and base regions. In addition, the aluminum film 18 is formed on the third poly-Si film 16 before patterning the poly-Si film 16, though an aluminum film is formed after the patterning step of the poly-Si film in the prior art. Of course, the stepping on the surface of the poly-Si film 16 before the patterning step is much moderate, compared with that of the underlying layer on which an aluminum film is deposited in the prior art. It follows that the aluminum wiring 18 after the patterning step is substantially free from breakage, compared with the prior art.

In forming the aluminum film 18, it is desirable to apply sputtering of aluminum while heating the substrate to 470°-530° C. In this method, the aluminum is deposited under a fluidized condition. As a result, a V-shaped groove present on the surface of the third poly-Si film 16 is completely filled with aluminum so as to enable the aluminum film 18 to have a flat surface. It follows that it is possible to moderate the stress concentration on the emitter opening portion after formation of a passivation film on the aluminum film 18. Moderation of the stress serves to suppress the mutual diffusion of the emitter poly-Si and aluminum, making it possible to suppress the breakage of the PN junction at the emitter region. This will be described in detail in conjunction with the embodiment shown in FIG. 8.

Figure 3:
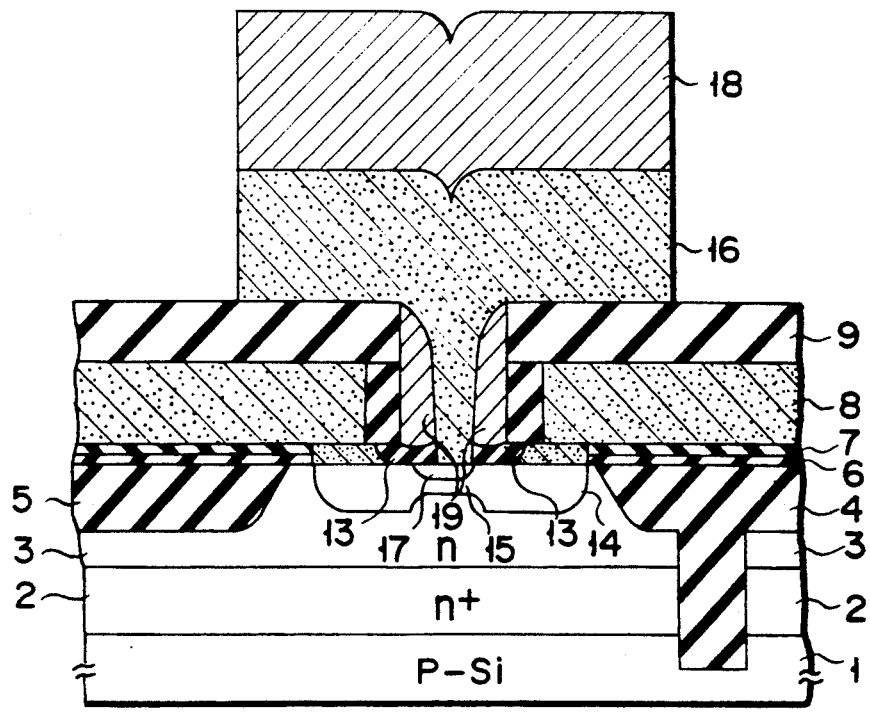
FIG. 3 is a cross sectional view for explaining a method according to a second embodiment of the present invention.

FIG. 3 shows a second embodiment of the present invention, which is a modification of the first embodiment shown in FIG. 2. In the second embodiment, the width of the emitter region is made smaller. This embodiment is effective in, for example, the cases:

1. Where it is necessary to control the relationship in size between the outer base region and the emitter region in order to improve the emitter withstand voltage;
2. Where it is necessary to diminish the emitter junction capacitance; and
3. Where it is necessary to suppress the emitter clouding effect.

In the second embodiment, a fourth poly-Si film 19 is selectively formed on the side wall of the opening portion after formation of the inner base region 15 shown in FIG. 2E, with the result that the width of the opening portion is diminished. The fourth poly-Si film 19 can be formed as follows. Specifically, after boron ion implantation for forming the inner base region 15, a poly-Si film of a predetermined thickness is deposited on the entire surface, followed by etching back the deposited poly-Si film by RIE such that the poly-Si film 19 is selectively left unremoved only o the side wall of the opening portion. As a result, a narrower opening portion for the emitter diffusion is obtained. In this case, the thermal oxide film 13 of the epitaxial layer 3 is also left unremoved partly. After formation of the poly-Si film 19, the steps as in the first embodiment of FIG. 2 are followed so as to manufacture a bipolar transistor with a narrower emitter region. If a material having a specific dielectric constant smaller than that of poly-Si is used for forming the film corresponding to the poly-Si film 19, it is possible to diminish the parasitic capacitance between the emitter and base regions. It is also possible to dope the poly-Si film 19 with arsenic.

The second embodiment shown in FIG. 3 permits producing the effects equal to those produced by the first embodiment.

FIGS. 4A to 4G collectively show a third embodiment of the present invention. In this embodiment, a laminate structure consisting of a thin CVD—SiO$_2$ film, a thin CVD—Si$_3$N$_4$ film and a thick CVD—SiO$_2$ film is used in place of the CVD oxide film 9 used in the first embodiment.

To be more specific, used is a p-type silicon substrate 1, and formed are an n+-type buried region 2, an n-type epitaxial layer 3, separating oxide films 4 and 5, a thermal oxide film 6 about 500 Å thick, a silicon nitride film 7 about 1000 thick and a first poly-Si film 8 about 4000 Å thick, as in the first embodiment. Then, boron ions are implanted into the first poly-Si film 8 under an accelerating energy of 50 KeV and at a dose of $1 \times 10^{16} cm^{-2}$ to obtain the state shown in FIG. 4A.

Figure 4A:
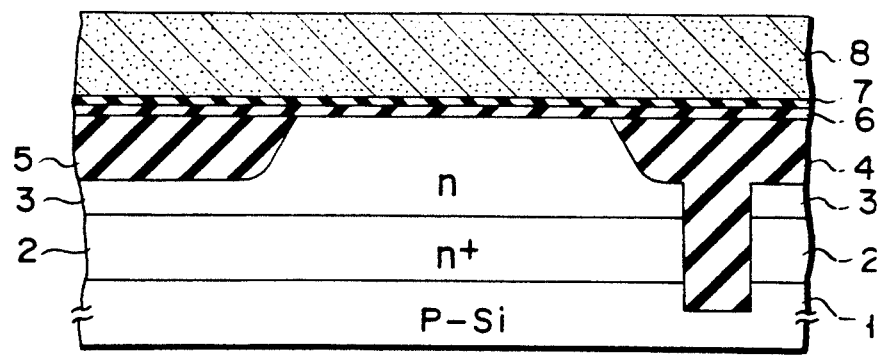
FIGS. 4A, 4B, 4C, 4D, 4E, 4F and 4G are cross sectional views collectively showing a method according to a third embodiment of the present invention for manufacturing a semiconductor device.
Figure 4B:
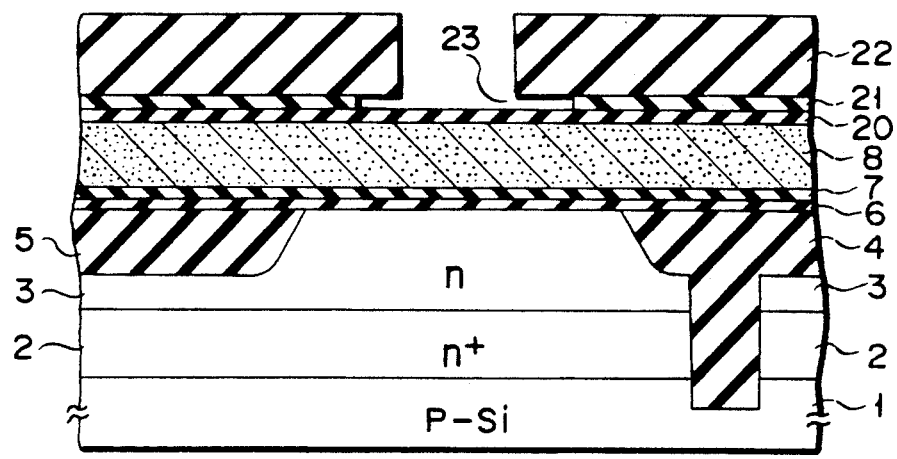

In the next step, a thin CVD—SiO$_2$ film 20 about 500 Å thick, a thin CVD—Si$_3$N$_4$ film 21 about 1500 Å thick and a thick CVD—SiO$_2$ film 22 about 5000 Å thick are formed on the entire surface of the first poly-Si film 8 to form a laminate structure consisting of the films 20, 21 and 22, as shown in FIG. 4B. Then, PEP is applied to the thick CVD—SiO$_2$ film 22 to form an opening portion at a position corresponding to the emitter diffusion region which is formed later. Further, an isotropic reactive plasma etching is applied using the CVD—SiO$_2$ film 22 having the opening portion formed therein as an etching mask so as to remove the CVD—Si$_3$N$_4$ film 21 exposed at the bottom of the opening portion. The reactive plasma etching noted above is a chemical dry etching using a mixed gas of CF$_4$, O$_2$ and N$_2$ as an etchant.

The etching is intentionally performed excessively such that a bore 23 is formed below the thick CVD—SiO₂ film 22 by the side etching of the CVD—Si₃N₄ film 21.

In the third embodiment, the CVD—SiO₂ film 22 can be formed sufficiently thick in view of the subsequent etching process regardless of the thickness of the first poly-Si film 8, as in the first embodiment.

Figure 4C:
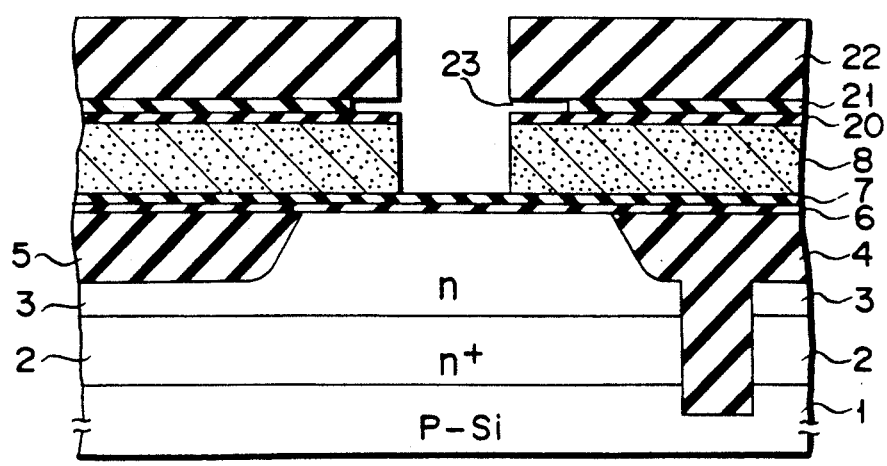
Figure 4D:
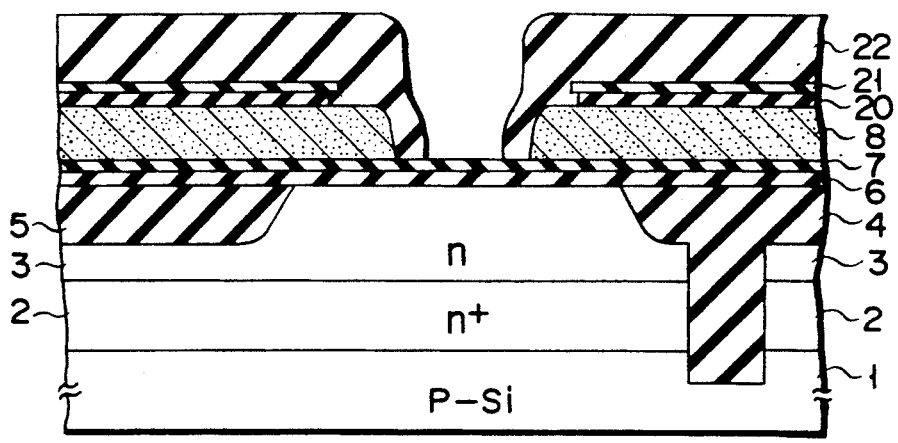

After removal of the silicon nitride film 21, the thin CVD—SiO₂ film 20 is removed by a reactive sputter etching, which is an anisotropic etching by RIE using a mixed gas of CHF₃ and O₂ as an etchant. Then, the first poly-Si film 8 is removed by a reactive plasma etching using the thick CVD—SiO₂ film 22 as an etching mask so as to expose the silicon nitride film 7, as shown in FIG. 4C. The reactive plasma etching is a chemical dry etching using a mixed gas of CF₄ and O₂ as an etchant.

Under the state shown in FIG. 4C, a wet oxidation is applied at 950° C. to form a thermal oxide film covering the side wall of the first poly-Si film 8. In this step, the bore 23 is filled with the thermal oxide film thus formed. Also, the CVD—Si₃N₄ film 21 acting as an oxidation stopper in this step serves to prevent out-diffusion of boron from the first poly-Si film 8. It follows that the resistance of the poly-Si film 8 is held much lower than in the first embodiment.

Figure 4E:
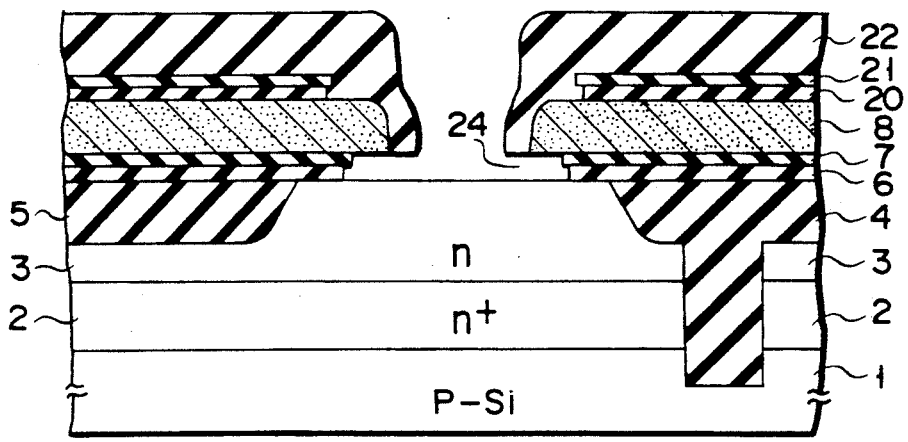

After the wet oxidation, the silicon nitride film 7 within the opening portion is etched with a hot phosphoric acid, as in the first embodiment. In this step, the etching is continued even after the thermal oxide film 6 below the nitride film 7 has been exposed such that the side etching of the nitride film 7 proceeds about 3000 Å. As a result, a bore 24 is formed right under the poly-Si film 8. Incidentally, the side etching does not take place in the CVD—Si₃N₄ film 21 in this step because the film 21 is covered with the thermal oxide film 22. This is why the CVD—Si₃N₄ film 21 is intentionally side-etched in the stage of FIG. 4B. Further, the exposed thermal oxide film 6 is etched with, for example, a NH₄F solution to expose the surface of the n-type epitaxial layer 3, as shown in FIG. 4E.

Figure 4F:
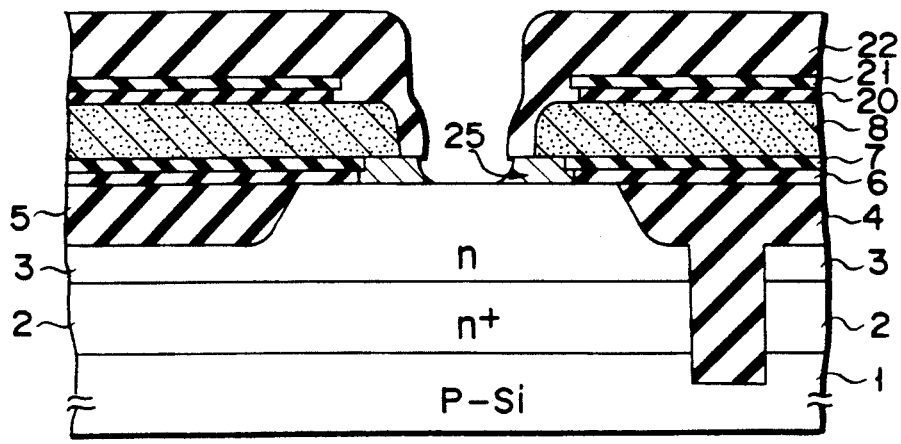

The subsequent process is basically equal to that in the first embodiment. Specifically, the bore 24 is filled with a second poly-Si film 25, as shown in FIG. 4F. The second poly-Si film 25 is formed as in the first embodiment.

Figure 4G:
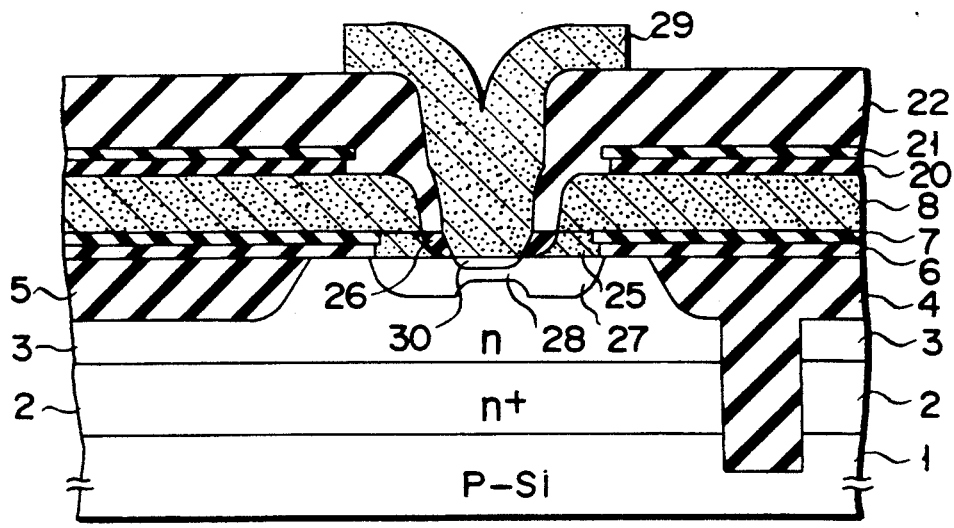

Then, the surface of the exposed epitaxial layer 3 and the side wall of the second poly-Si film 25 are thermally oxidized to form a thermal oxide film 26 about 700 Å thick, as shown in FIG. 4G. In this heat treatment, the boron doped in advance in the first poly-Si film 8 is diffused into the second poly-Si film 25 and into the epitaxial layer 4 to form a p⁺-type outer base region 27. The first and second poly-Si films 8 and 25 collectively form the base electrode. Boron is certainly diffused during the heat treatment into the CVD—SiO₂ film 22. However, the CVD—Si₃N₄ film 21 covering the most portion of the first poly-Si film 8 serves to suppress the out-diffusion of boron. In other words, it is possible to prevent the increase of the base resistance caused by the boron out-diffusion. The thin CVD—SiO₂ film 20 simply acts as a buffer and is irrelevant to the effect described above.

After formation of the outer base region 27, boron ions are implanted through the opening portion under an accelerating energy of 20 KeV and at a dose of $2 \times 10^{13} cm^{-2}$ to form a p-type inner base region 28 within the epitaxial layer 3. Alternatively, the boron ion implantation for forming the inner base region 28 may be performed after removal of the silicon nitride film 7 shown in FIG. 2D, or after removal of the silicon oxide film 6 below the nitride film 7.

In the next step, the oxide film 26 at the bottom portion of the opening portion is selectively removed by reactive sputter etching, as in the first embodiment. As a result, the epitaxial layer 3 is exposed to form an emitter diffusion window. Then, a third poly-Si film 29 is deposited on the entire surface by CVD in a thickness of about 2000 Å, followed by implanting arsenic ions into the poly-Si film 29 under an accelerating energy of 50 KeV and at a dose of $1 \times 10^{16} cm^{-2}$. After the ion implantation, a heat treatment is applied to diffuse the arsenic doped in the poly-Si film 29 into the inner base region 27 to form an n⁺-type emitter region 30. Further, the third poly-Si film 29 is patterned by PEP as shown in FIG. 4G. Finally, an aluminum film (not shown) is formed by vapor deposition and, then, patterned by PEP to form an aluminum wiring and, thus, to manufacture a desired bipolar transistor. In these PEP step, the CVD-oxide film 22 is used as an etching stopper. As described previously, the CVD-oxide film 22 is thick enough to perform the function of an etching stopper. Incidentally, it is possible to pattern the third poly-Si film 29 and the aluminum film simultaneously, as in the first embodiment.

The third embodiment described above permits producing the effects equal to those explained previously in conjunction with the first embodiment. In addition, the CVD—Si₃N₄ film 21 suppresses the out-diffusion of boron from the first poly-Si film 8 in the third embodiment, as described previously, making it possible to keep the base resistance at a lower level.

Figure 5:
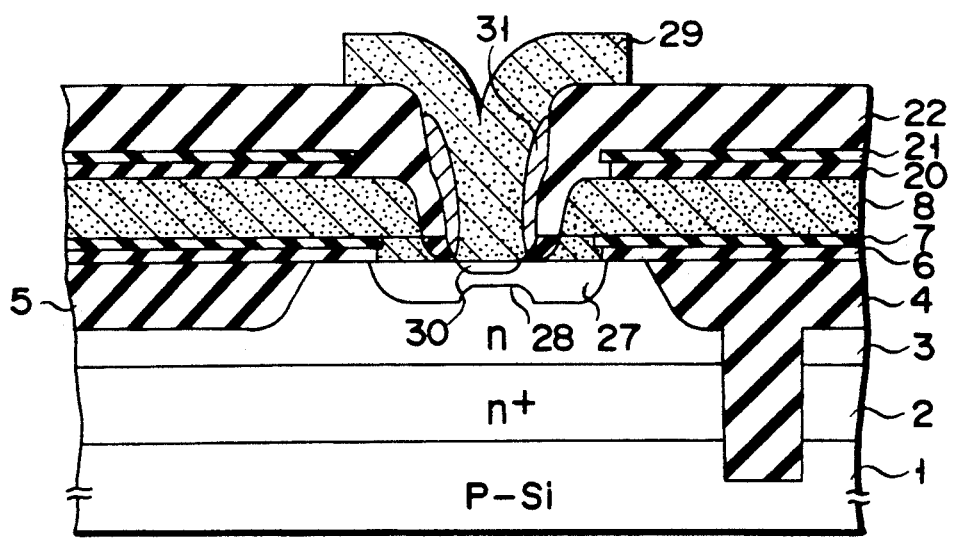
FIG. 5 is a cross sectional view for explaining a method according to a fourth embodiment of the present invention.

FIG. 5 shows a fourth embodiment of the present invention, which is a modification of the third embodiment shown in FIG. 4. As in the second embodiment shown in FIG. 3, the width of the emitter region is diminished in the fourth embodiment in order to suppress the emitter clouding effect.

In the fourth embodiment, a fourth poly-Si film 31 is selectively formed on the side wall of the opening portion to diminish the width of the opening portion as shown in FIG. 5 after formation of the inner base region 27 as in the third embodiment. The fourth poly-Si film 31 is formed as in the second embodiment. As a result, the opening portion for the emitter diffusion is diminished, making it possible to form an emitter region 30 of a smaller width.

FIGS. 6A to 6G collectively show a fifth embodiment of the present invention. In this embodiment, a poly-Si film is laminated on the silicon oxide film 9 formed in the first embodiment in order to improve the protecting effect against the etching.

The fifth embodiment is equal to the first embodiment until formation of the silicon oxide film 9. After formation of the silicon oxide film 9, a protective poly-Si film 40, which is undoped, is formed by CVD on the silicon oxide film 9 in the fifth embodiment, as shown in FIG. 6A. As described previously in conjunction with the first embodiment, the silicon oxide film 9 is formed by CVD, making it possible to form the film 9 sufficiently thick without reduction in the thickness of the first poly-Si film 8. In addition, since the protective poly-Si film 40 is laminated in the fifth embodiment, the thickness of the silicon oxide film 9 is not reduced even after the subsequent etching steps. It follows that the short-circuiting between the base and emitter regions can be prevented more effectively than in the first embodiment.

The subsequent steps are substantially equal to those in the first embodiment. Specifically, the protective poly-Si film 40, the silicon oxide film 9 and the first poly-Si film 8 are selectively etched in succession by PEP to form an opening portion exposing the silicon nitride film 7, as shown in FIG. 6B. The opening portion is formed at a position corresponding to an emitter diffusion region.

After formation of the opening portion, a wet oxidation is performed at 950° C. to form thermal oxide films 41 and 42 to cover the exposed surfaces of the first poly-Si film 8 and the protective poly-Si film 40, as shown in FIG. 4C. Then, the silicon nitride film 7 within the opening portion is removed by etching with a hot phosphoric acid, using the thermal oxide films 41, 42 as an etching mask. The etching is intentionally continued even after the thermal oxide film 6 below the silicon nitride film 7 has been exposed so as to cause about 3000 Å etching of the silicon nitride film 7. As a result, a bore 43 is formed right under the poly-Si film 8. Then, the exposed thermal oxide film 6 is etched with, for example, a NH₄F solution so as to expose the surface of the n-type epitaxial layer 3, as shown in FIG. 6C.

In the next step, the bore 43 is filled with a second undoped poly-Si film 44, as shown in FIG. 6D. The poly-Si film 44 is formed as in the first embodiment. Then, a heat treatment is performed under an oxidative atmosphere so as to form a thermal oxide film 45 having a thickness of about 700 Å and covering the exposed surface of the epitaxial layer 3 and the side surface of the second poly-Si film 44. During the heat treatment, boron is diffused from the first poly-Si film 8 into the second poly-Si film 44 and into the epitaxial layer 3 so as to form a p⁺-type outer base region 46, as shown in FIG. 6E. Then, boron ions are implanted through the opening portion under an accelerating energy of 20 KeV and at a dose of $2 \times 10^{13} cm^{-2}$ to form a p-type inner base region 47. Further, the oxide film 45 at the bottom of the opening portion is selectively removed by a reactive sputter etching so as to obtain the state shown in FIG. 6E in which an emitter diffusion window is formed.

The thermal oxide film 42 may also be removed together with the oxide film 45. Also, the boron ion implantation for forming the inner base region 47 may be performed after, for example, removal of the silicon nitride film 7 in the step shown in FIG. 6C or after removal of the silicon oxide film 6 below the nitride film 7.

After selective removal of the oxide film 45 at the bottom of the opening portion, a third poly-Si film 48 about 2000 Å thick is formed by CVD on the entire surface, followed by implanting arsenic ions into the poly-Si film 48 under an accelerating energy of 50 KeV and at a dose of $1 \times 10^{16} cm^{-2}$. Then, a heat treatment is applied to diffuse the arsenic doped in the poly-Si film 48 into the inner base region 47 so as to form an n⁺-type emitter region 49. At the same time, the outer base region 46 and the inner base region 47 are turned into the final diffusion layers.

Figure 6F:
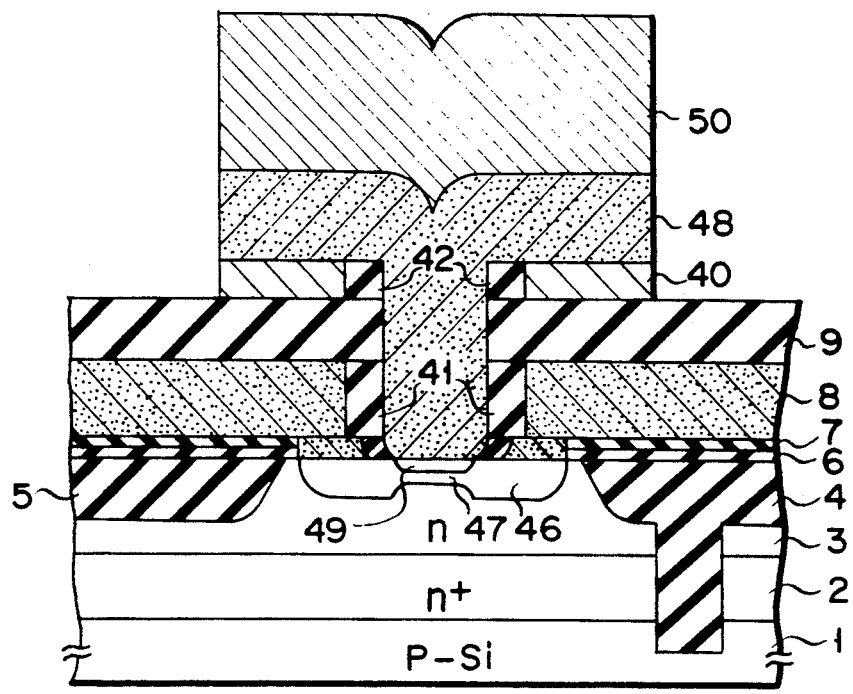

In the next step, a base contact reaching the first poly-Si film 8 is formed by PEP, followed by forming an aluminum film 50 on the entire surface by vacuum evaporation. Then, the aluminum film 50 and the third poly-Si film 48 are simultaneously patterned by PEP to form the required electrode and wiring, thereby manufacturing a desired bipolar transistor as shown in FIG. 6F.

The fifth embodiment produces effects similar to those produced by the first embodiment. In addition, since the silicon oxide film 9 is further protected by the protective poly-Si film 40, reduction in the thickness of the silicon oxide film 9 is completely prevented in the subsequent etching steps. Naturally, the silicon oxide film 9 acts as a perfect etching stopper in the final step of forming the aluminum wiring, making it possible to prevent the short-circuiting between the base and emitter regions more satisfactorily than in the first embodiment.

Figure 7:
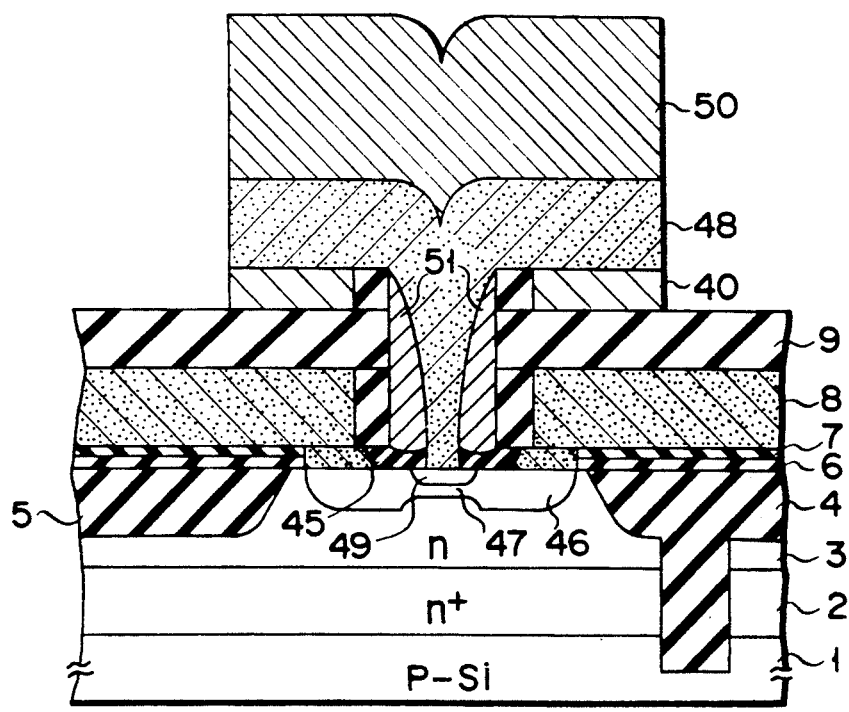
FIG. 7 is a cross sectional view for explaining a method according to a sixth embodiment of the present invention.

FIG. 7 shows a sixth embodiment of the present invention, which is a modification of the fifth embodiment shown in FIG. 6. In the sixth embodiment, the width of the emitter region is diminished as in the second embodiment in order to suppress the emitter clouding effect. In the sixth embodiment, a fourth film 51 is selectively formed on the side wall the opening portion as shown in FIG. 7 so as to diminish the width of the opening portion after formation of the inner base region 47 in the fifth embodiment. The fourth poly-Si film 51 is formed as in the second embodiment. Since the opening portion for the emitter diffusion can be diminished, it is possible to diminish the width of the emitter region 49 in the sixth embodiment. It should be noted that a material having a specific dielectric constant smaller than that of poly-Si can be used for forming a film corresponding to the fourth poly-Si film 51 so as to further diminish the parasitic capacitance between the emitter and base regions, as explained previously in conjunction with the second embodiment.

Figure 8:
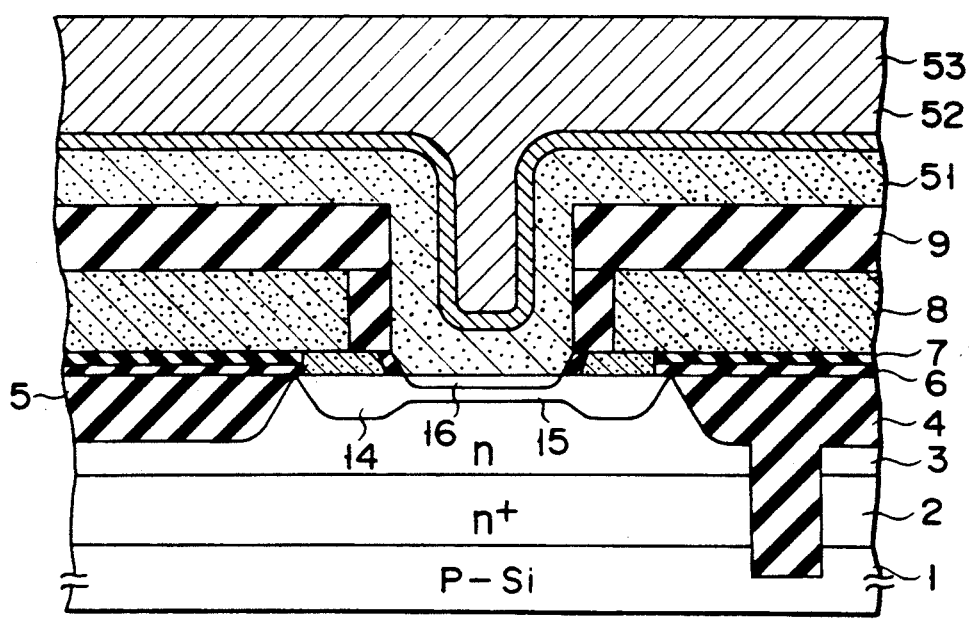
FIG. 8 is a cross sectional view for explaining a method according to a seventh embodiment of the present invention.

FIG. 8 shows a seventh embodiment of the present invention, which includes an effective means for moderating the stress concentration on the emitter electrode.

In this embodiment, the construction as shown in FIG. 2E is obtained as in the first embodiment. Then, the oxide film 13 at the bottom portion of the opening portion is removed as in the first embodiment so as to form an emitter diffusion window. Further, a third poly-Si film 51 about 2000 Å thick is deposited on the entire surface by LPCVD, followed by doping the poly-Si film 51 with arsenic by means of ion implantation under an accelerating energy of 50 keV and a dose of $1 \times 10^{16} cm^{-2}$. It should be noted that, since poly-Si film formed by LPCVD has a good step coverage, the third poly-Si film 51 is formed in a uniform thickness along the wall surface of the emitter opening portion, as seen from FIG. 8. As a result, an emitter opening portion with a groove width of about 4000 Å is present even in this stage. Then, a heat treatment is applied so as to diffuse the arsenic within the poly-Si film 51 into the inner base region 15 and, thus, to form an N⁺ type emitter region 16, as shown in FIG. 8. At the same time, the outer base region 14 and the inner base region 15 are turned into the final diffusion layers.

In the next step, a Ti layer having a thickness of 200 Å and a TiN layer having a thickness of 700 Å are formed in this order by means of sputtering so as to form a buffer layer 52. Then, an aluminum film 53 about 800 Å thick is formed by sputtering while heating the substrate to 470°–530 ° C. As described previously, aluminum is deposited in a fluidized condition. Thus, the emitter opening is completely filled with the aluminum film 53, and the aluminum film 53 has a flat surface, as shown in the drawing. After formation of the aluminum film 53, PEP is applied as in the first embodiment so as to pattern simultaneously the aluminum film 53, the buffer layer 52 and the third poly-Si film 51, thereby forming a bipolar transistor provided with the required electrodes and wirings.

In the seventh embodiment described above, the emitter opening portion is completely filled with the aluminum film 53, making it possible to avoid the stress concentration on said portion. Moderation of the stress permits suppressing the mutual diffusion of the emitter poly-Si and aluminum, making it possible to suppress the breakage of the PN junction in the emitter region. What should also be noted that the buffer layer 52 interposed in the seventh embodiment between the aluminum film 53 and the emitter poly-Si film 51 acts as a barrier to the mutual diffusion of the emitter poly-Si and aluminum. It follows that the mutual diffusion of the emitter poly-Si and aluminum can be prevented substantially completely. As a result, it is possible to prevent a shallow junction in the emitter region from being broken by the aluminum diffusion. Further, the aluminum grains grow large, if the aluminum film 53 is formed by sputtering at a high temperature, leading to a high resistance to electromigration. This also serves to prevent the emitter junction from being broken.

It is possible to modify the method of the present invention in various fashions within the technical scope of the present invention. For example, the emitter region (17, 30, 49) was formed in the embodiments described above by a solid phase diffusion from the third poly-Si film (16, 29, 48) doped with arsenic. However, it is possible to form the emitter region by a direct arsenic ion implantation in place of the solid phase diffusion. In the case of the direct arsenic ion implantation, the oxide film about 700 Å thick, which was used as a buffer in the step of boron ion implantation for forming the inner base region, can be used as it is as a buffer. It is also possible to remove the oxide film such that the arsenic ion implantation is performed without using a buffer. Further, it is possible to implant arsenic ions through the third poly-Si film (16, 29, 48) by controlling the accelerating energy for the ion implantation.

It is also possible to replace the first, second and third poly-Si films included in the embodiments described above by a film of, for example, a silicide of a metal having a high melting point such as molybdenum silicide or tungsten silicide as well as amorphous silicon or microcrystalline silicon. Where the emitter region is formed by ion implantation, it is possible to replace the third poly-Si film by another conductor film which is incapable of providing a source of the solid phase diffusion.

Further, in each of the embodiments described above, thermal oxidation is employed for forming the oxide film (10, 22, 41, 42) on the surface of the poly-Si film exposed at the side wall of the opening portion formed at the position corresponding to the emitter diffusion region. However, it is also possible to replace the thermal oxidation method by a method similar to that employed for forming the poly-Si film (19, 31, 51) in the embodiments of, for example, FIGS. 3, 5 and 7.

What is claimed is:

1. A method of manufacturing a semiconductor device, comprising the steps of:
    successively laminating a first buffer insulation film, an oxidation-resistant insulation film, a first conductor film containing an impurity of a second conductivity type and a second buffer insulation film on a semiconductor layer having a collector region of a first conductivity type;
    forming a first protective insulation film by a deposition method on the second buffer insulation film, said first protective insulation film consisting of a laminate structure consisting of a silicon nitride film and a thick silicon oxide film which are deposited successively;
    forming an opening portion below which an emitter diffusion region is later formed and exposing the oxidation-resistant insulation film by selectively etching the first protective insulation film, the second buffer insulation film and the first conductor film, only the silicon nitride film of the first protective film being overetched to retreat an end thereof from the opening portion, thereby forming a first bore below the thick silicon oxide film;
    forming a second protective insulation film to cover the surface of the first conductor film exposed at a side wall of the opening portion;
    etching the oxidation-resistant insulation film exposed at the bottom of the opening portion using the first and second protective insulation films as an etching mask so as to expose the first buffer insulation film, a predetermined size of a second bore being formed by side etching below the conductor film;
    etching the exposed first buffer insulation film to expose a surface of the collector region of the semiconductor layer;
    burying in the second bore a second conductor film capable of an insulation film formation by surface oxidation and also capable of an impurity diffusion;
    applying a heat treatment under an oxidative atmosphere to form a thermal oxide film covering the exposed surface of the collector region and the surface of the second conductor film buried in the second bore and to diffuse the impurity of the second conductivity type contained in the first conductor film into the collector region through the second conductor film so as to form an outer base region of the second conductivity type;
    doping the collector region with an impurity of the second conductivity type through the opening portion so as to form an inner base region of the second conductivity type; and
    doping the inner base region with an impurity of the first conductivity type so as to form an emitter region of the first conductivity type and to form an emitter electrode in ohmic contact with the emitter region.

2. A method of manufacturing a semiconductor device according to claim 1, wherein said first protective insulation film comprises of a laminate structure consisting of a thin silicon oxide film, a silicon nitride film and a thick silicon oxide film which are successively formed by deposition method.

3. A method of manufacturing a semiconductor device according to claim 1, wherein forming the emitter region and the emitter electrode comprises the steps of:
    removing the thermal oxide film covering the bottom surface of the opening portion by anisotropic etching to expose a surface of the inner base region;
    forming a poly-Si film containing an impurity of the first conductivity type on the entire surface of the structure;
    forming said emitter region of the first conductivity type by thermal diffusion using as a diffusion source the poly-Si film containing an impurity of the first conductivity type;

successively laminating a buffer layer and an aluminum film on the poly-Si film, the buffer layer acting as a barrier to mutual diffusion of poly-Si and aluminum; and forming the emitter electrode in ohmic contact with the emitter region by selectively etching and patterning the poly-Si film, buffer layer and aluminum film.

4. A method of manufacturing a semiconductor device, comprising:

successively laminating a buffer insulation film, an oxidation-resistant insulation film and a first conductor film containing an impurity of a second conductivity type on a semiconductor layer having a collector region of a first conductivity type;

forming a first protective insulation film by a deposition method on the first conductor film;

forming an opening portion exposing the oxidation-resistant insulation film by selectively etching the protective insulation film and the first conductor film, an emitter diffusion region being formed later blow said opening portion;

forming a second protective insulation film to cover the surface of the first conductor film exposed at a side wall of the opening portion;

etching the oxidation-resistant insulation film exposed at the bottom of the opening portion using the first and second protective insulation films as an etching mask so as to expose the buffer insulation film, a predetermined size of a bore being formed by side etching below the conductor film;

etching the exposed buffer insulation film to expose a surface of the collector region of the semiconductor layer;

burying in the bore a second conductor film capable of an insulation film formation by surface oxidation and also capable of an impurity diffusion;

applying a heat treatment under an oxidative atmosphere to form a thermal oxide film covering the exposed surface of the collector region and the surface of the second conductor film buried in the bore and to diffuse the impurity of the second conductivity type contained in the first conductor film into the collector region through the second conductor film so as to form an outer base region of the second conductivity type;

doping the collector region with an impurity of the second conductivity type through the opening portion so as to form an inner base region of the second conductivity type;

removing the thermal oxide film covering the bottom surface of the opening portion by anisotropic etching to expose a surface of the inner base region;

forming a poly-Si film containing an impurity of the first conductivity type on the entire surface of the structure;

forming an emitter region of the first conductivity type by thermal diffusion using as a diffusion source the poly-Si film containing an impurity of the first conductivity type;

successively laminating a buffer layer and an aluminum film on the poly-Si film, the buffer layer acting as a barrier to mutual diffusion of poly-Si and aluminum; and forming an emitter electrode in ohmic contact with the emitter region by selectively etching and patterning the poly-Si film, buffer layer and aluminum film;

wherein laminating the aluminum film comprises sputtering at 470° C. to 520° C. under conditions in which the deposited aluminum is fluidized and fills a recess in the opening portion above the emitter region.

5. A method of manufacturing a semiconductor device according to claim 4, wherein the buffer layer comprises a laminate film consisting of a Ti layer and a TiN layer.

6. A method of manufacturing a semiconductor device according to claim 4, further comprising the steps of:

forming, by a deposition method, a protective conductor film laminated on the first protective insulation film;

selectively etching the protective conductor film together with the first protective insulation film in order to form said opening portion;

covering the surface of the protective conductor film with said second protective insulation film which covers the surface of the first conductor film;

removing the second protective insulation film from a top surface of the protective conductor film by anisotropic etching; and selectively etching and patterning the protective conductor film together with the poly-Si film and the aluminum film in the step of forming the emitter electrode.

7. A method of manufacturing a semiconductor device according to claim 6, wherein said protective conductor film comprises a poly-Si film.

8. A method of manufacturing a semiconductor device according to claim 6, further comprising:

forming, on the poly-Si film, an aluminum film forming said emitter electrode by sputtering at 470° C. to 530° C.

* * * * *